US005731242A

United States Patent [19]
Parat et al.

[11] Patent Number: 5,731,242
[45] Date of Patent: Mar. 24, 1998

[54] SELF-ALIGNED CONTACT PROCESS IN SEMICONDUCTOR FABRICATION

[75] Inventors: Krishna K. Parat, Palo Alto; Glen N. Wada, Fremont; Gregory E. Atwood; Daniel N. Tang, both of San Jose, all of Calif.

[73] Assignee: Intel Corporation, Santa Clara, Calif.

[21] Appl. No.: 557,904

[22] Filed: Nov. 14, 1995

Related U.S. Application Data

[63] Continuation of Ser. No. 138,741, Oct. 15, 1993, abandoned.
[51] Int. Cl.[6] ................................................. H01L 21/82
[52] U.S. Cl. .................... 438/586; 438/593; 438/595; 438/637; 438/211
[58] Field of Search ........................ 438/586, 588, 438/587, 592, 595, 593, 594, 637, 211, 355, 203; 257/315, 316

[56] References Cited

U.S. PATENT DOCUMENTS

| | | | |
|---|---|---|---|
| 4,876,213 | 10/1989 | Pfiester | 437/34 |
| 4,982,250 | 1/1991 | Manos, II et al. | |
| 5,149,665 | 9/1992 | Lee | 437/43 |
| 5,208,174 | 5/1993 | Mori | 437/43 |
| 5,210,047 | 5/1993 | Woo et al. | 437/43 |
| 5,215,933 | 6/1993 | Araki | 437/43 |
| 5,238,873 | 8/1993 | Higashizono et al. | 437/193 |
| 5,340,760 | 8/1994 | Komori et al. | 437/43 |
| 5,376,571 | 12/1994 | Bryant et al. | 437/43 |
| 5,384,287 | 1/1995 | Fukase | 437/228 |

FOREIGN PATENT DOCUMENTS

| | | | |
|---|---|---|---|
| 0 430 829 A1 | 6/1991 | France | 21/82 |
| 0 468 901 A1 | 1/1992 | France | 21/82 |

OTHER PUBLICATIONS

Fukase, T., et al., "A Margin–Free Contact Process Using An Al$_2$O$_3$ Etch–Stop Layer for High Density Devices," IEDM, pp. 837–840 (1992).

Kakumu, M., et al., "PASPAC (Planarized Al/Silicide/Poly Si with Self Aligned Contact) with Low Contact Resistance and High Reliability in CMOS LSIs," *1987 Symposium on VLSI Technology: Digest of Technical Papers*, Karuizawa, pp. 77–78 (May 18–21, 1987).

Kenny, D., et al., "A Buried–Plate Trench Cell for a 64–Mb DRAM," *1992 Symposium on VLSI Technology: Digest of Technical Papers*, pp. 14–15 (1992).

Kusters, K.H., et al., "A High Density 4Mbit dRAM Process Using a Fully Overlapping Bitline Contact (FoBIC) Trench Cell," *1987 Symposium on VLSI Technology: Digest of Technical Papers*, Karuizawa, pp. 93–94 (May 18–21, 1987).

Kusters, K.H., et al., "A Stacked Capacitor Cell with a Fully Self–Aligned Contact Process for High–Density Dynamic Random Access Memories," *Journal of the Electrochemical Society*, vol. 139, No. 8, pp. 2318–2321 (Aug. 1992).

Subbanna, S., et al., "A Novel Borderless Contact/Interconnect Technology Using Aluminum Oxide Etch Stop or High Performance SRAM and Logic," *IEDM Technical Digest*, International Electron Devices Meeting, Washington, D.C., pp. 441–444 (Dec. 5–8, 1993).

(List continued on next page.)

*Primary Examiner*—Mary Wilczewski
*Attorney, Agent, or Firm*—Blakely, Sokoloff, Taylor & Zafman

[57] ABSTRACT

The encapsulation of gate stacks of a semiconductor device in an oxide insulative layer and in a silicon nitride etch-stop layer allows the formation of a contact filling for connection to underlying diffusion regions without risk of accidental diffusion contact to gate shorts created by the contact filling. As a result, the gate stacks may be patterned closer together, thus reducing the cell size and increasing the cell density. Furthermore, use of the etch-stop layer makes contact lithography easier since the size of the contact opening can be increased and contact alignment tolerance made less stringent without concern of increasing the cell size or of creating diffusion contact to gate shorts.

23 Claims, 7 Drawing Sheets

OTHER PUBLICATIONS

Ueno, K., et al., "A Quarter-Micron Planarized Interconnection Technology with Self-Aligned Plug," IEDM, pp. 305–308 (1992).

Becker, D.S., et al., "A Method of Obtaining High Oxide to Nitride Selectivity in an MERIE Reactor", *Extended Abstracts*, vol. 93–1, The Electrochemical Society, Inc., Spring Meeting, Honolulu, Hawaii, pp. 367–368 (May 16–21, 1993).

Armacost, M., et al., "Selective Oxide:Nitride Dry Etching in a High Density Plasma Reactor,"*Extended Abstracts*, vol. 93–1, The Electrochemical Society, Inc., Spring Meeting, Honolulu, Hawaii, pp. 369–370 (May 16–21, 1993).

"Self–Isolated Tapered Submicron Contact Hole with Variable Double Isolator Thickness," *IBM Technical Disclosure Bulletin*, vol. 32, No. 8B, pp. 456–458 (Jan. 1990).

"Gate Level Stack to Minimize Contact–Spacing Groundrule," *IBM Technical Disclosure Bulletin*, vol. 33, No. 6A, pp. 469–471 (Nov. 1990).

"Fabricating One Semiconductor Contact Stud Borderless to Another," *IBM Technical Disclosure Bulletin*, vol. 34, No. 4B, pp. 277–279 (Sep. 1991).

"Sputtered Metal Local Interconnect Process," *IBM Technical Disclosure Bulletin*, vol. 36, No. 1, pp. 61–62 (Jan. 1993).

"Borderless Diffusion Contact Studs," *IBM Technical Disclosure Bulletin*, vol. 36, No. 3, pp. 165–166 (Mar. 1993).

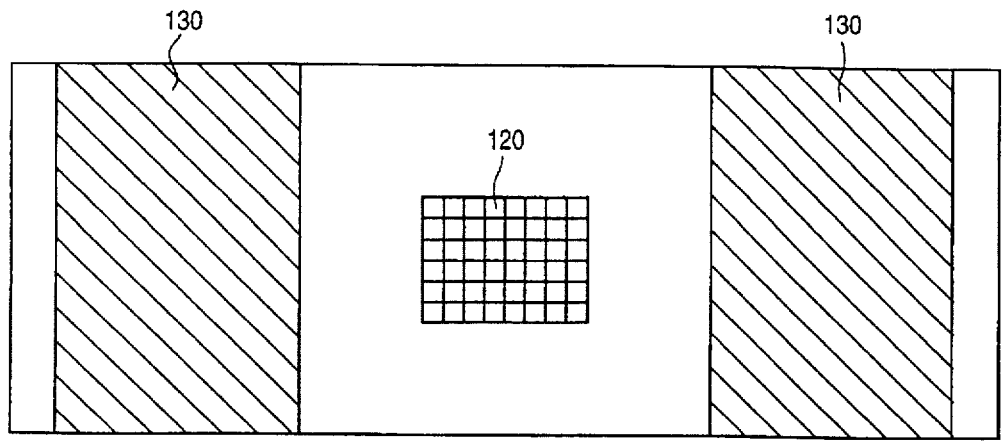
FIG_1 (PRIOR ART)
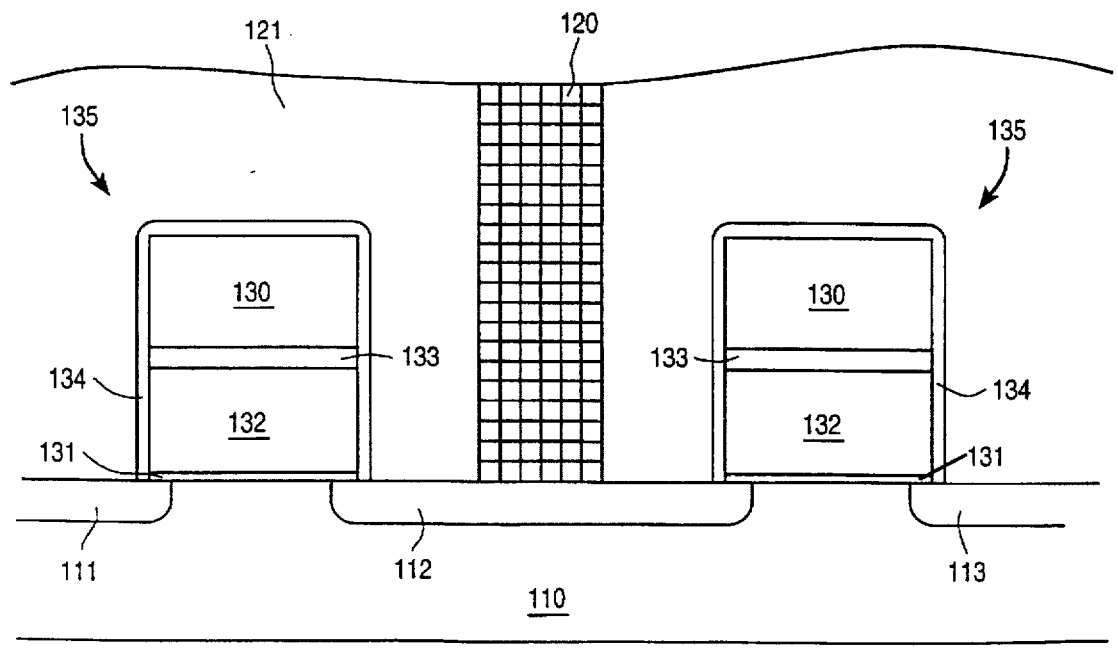
FIG_2 (PRIOR ART)

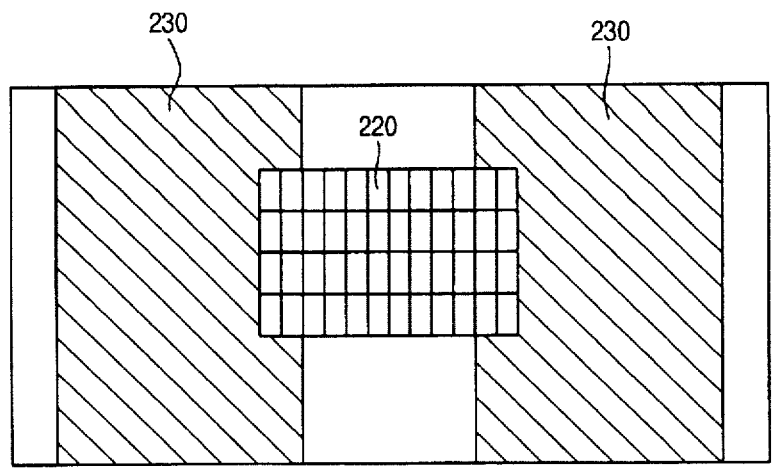
FIG_3
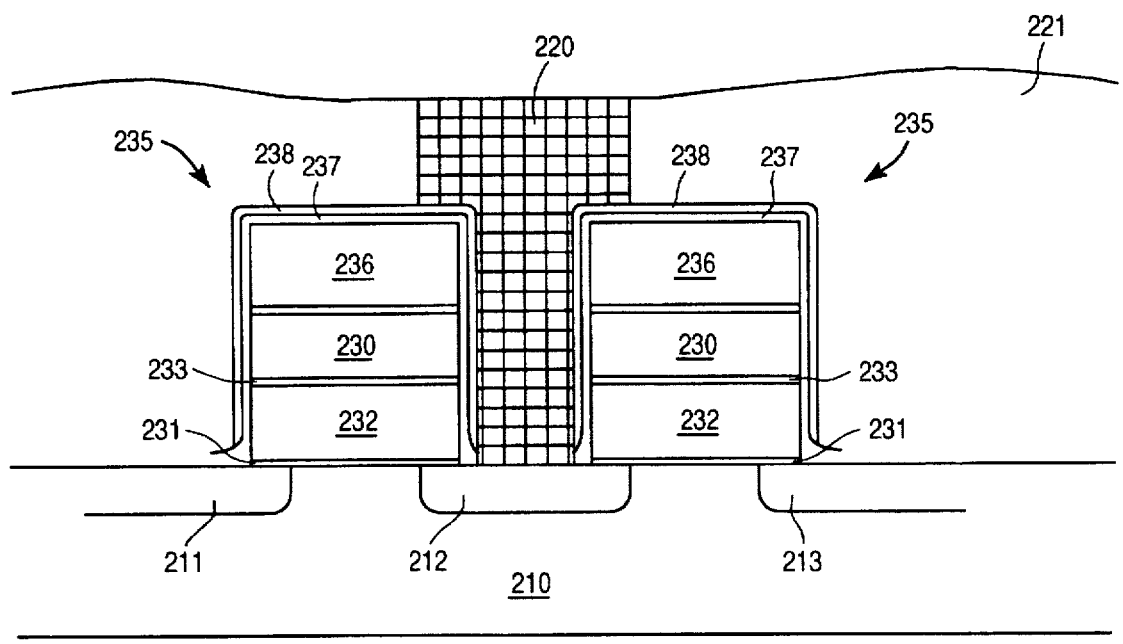
FIG_4

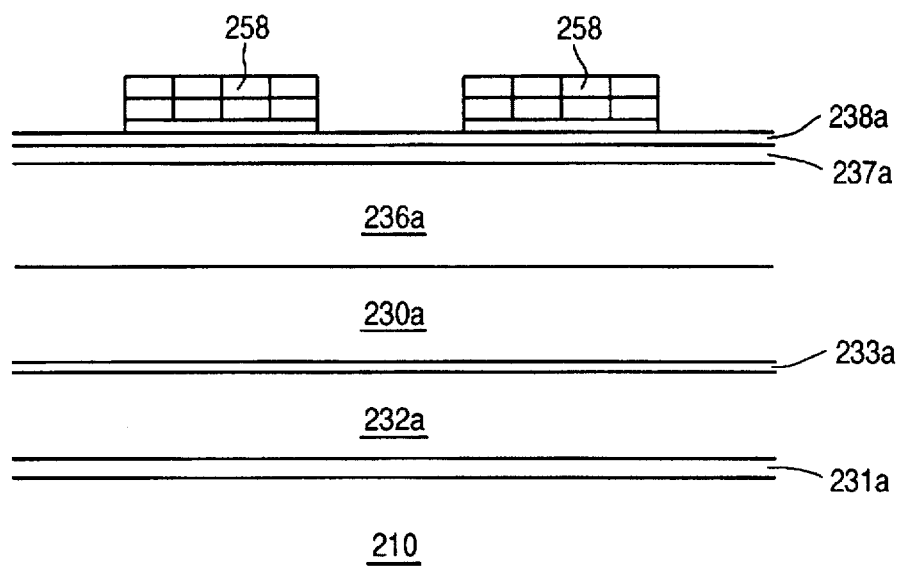
FIG_5
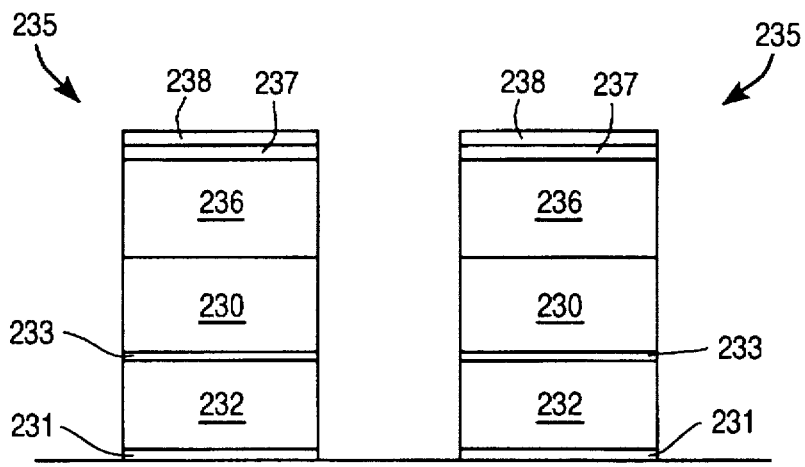
FIG_6

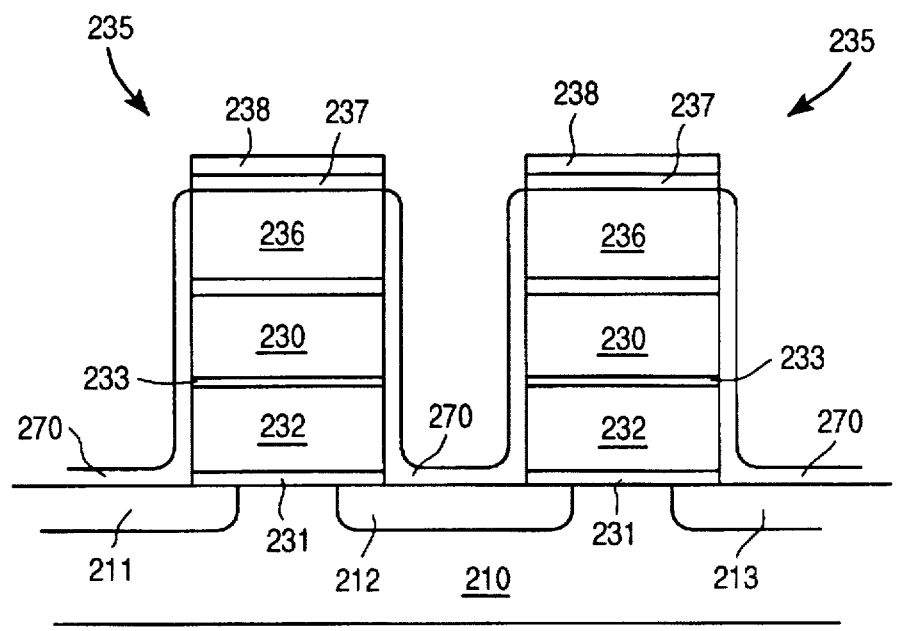
FIG_7
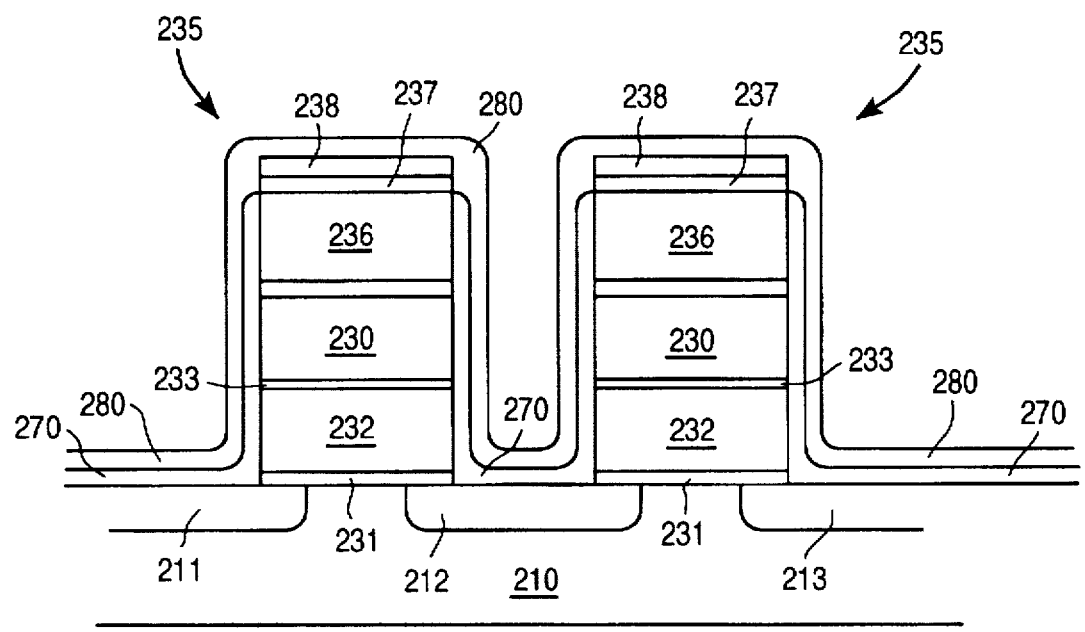
FIG_8

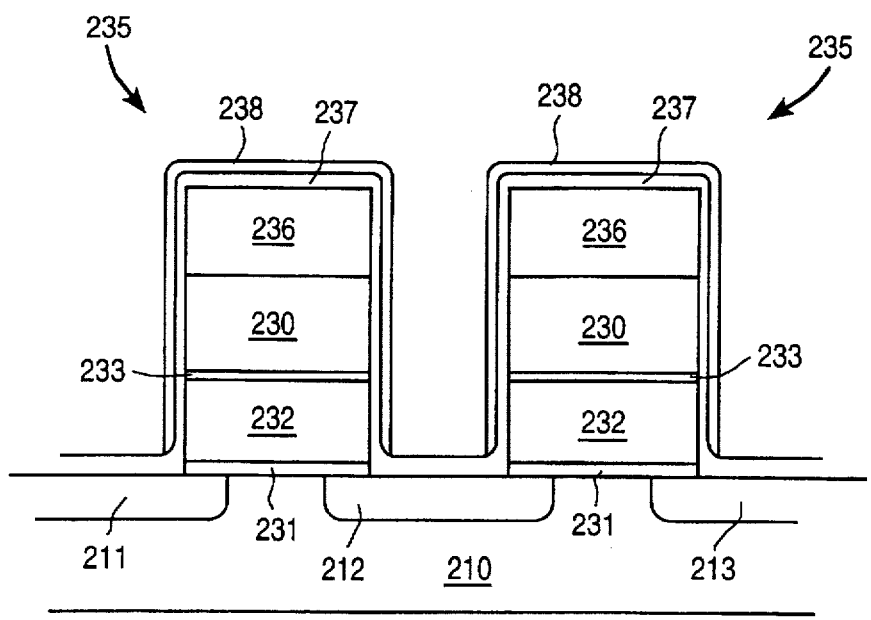
FIG_9
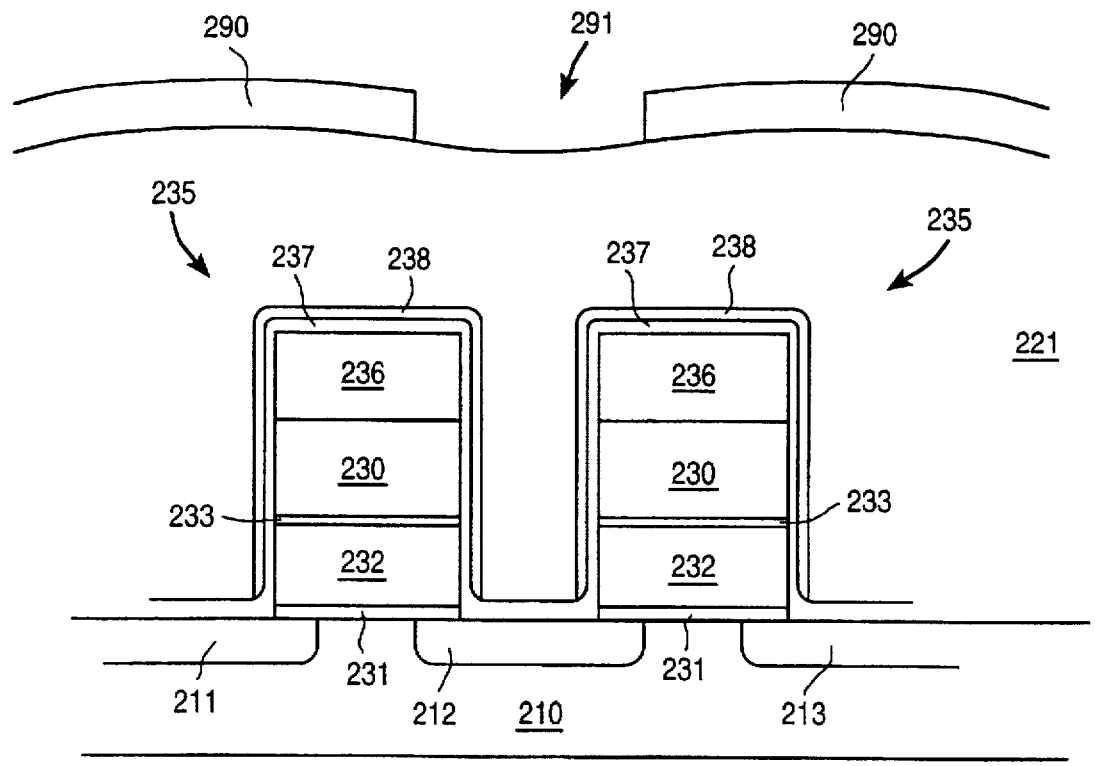
FIG_10

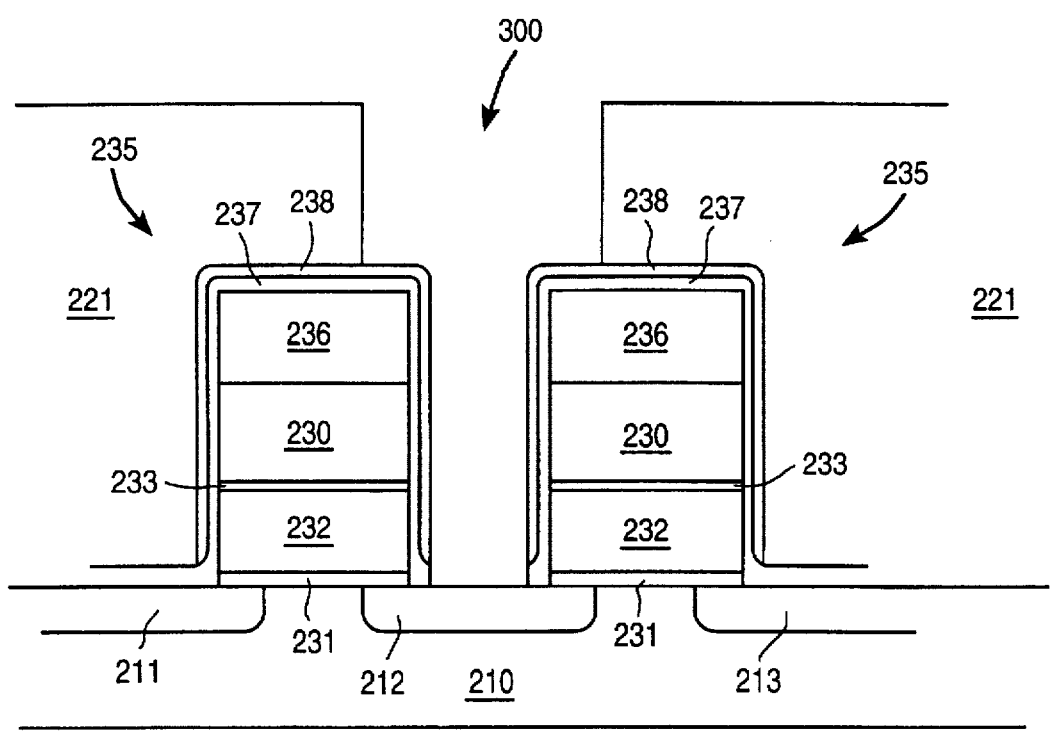
FIG_11

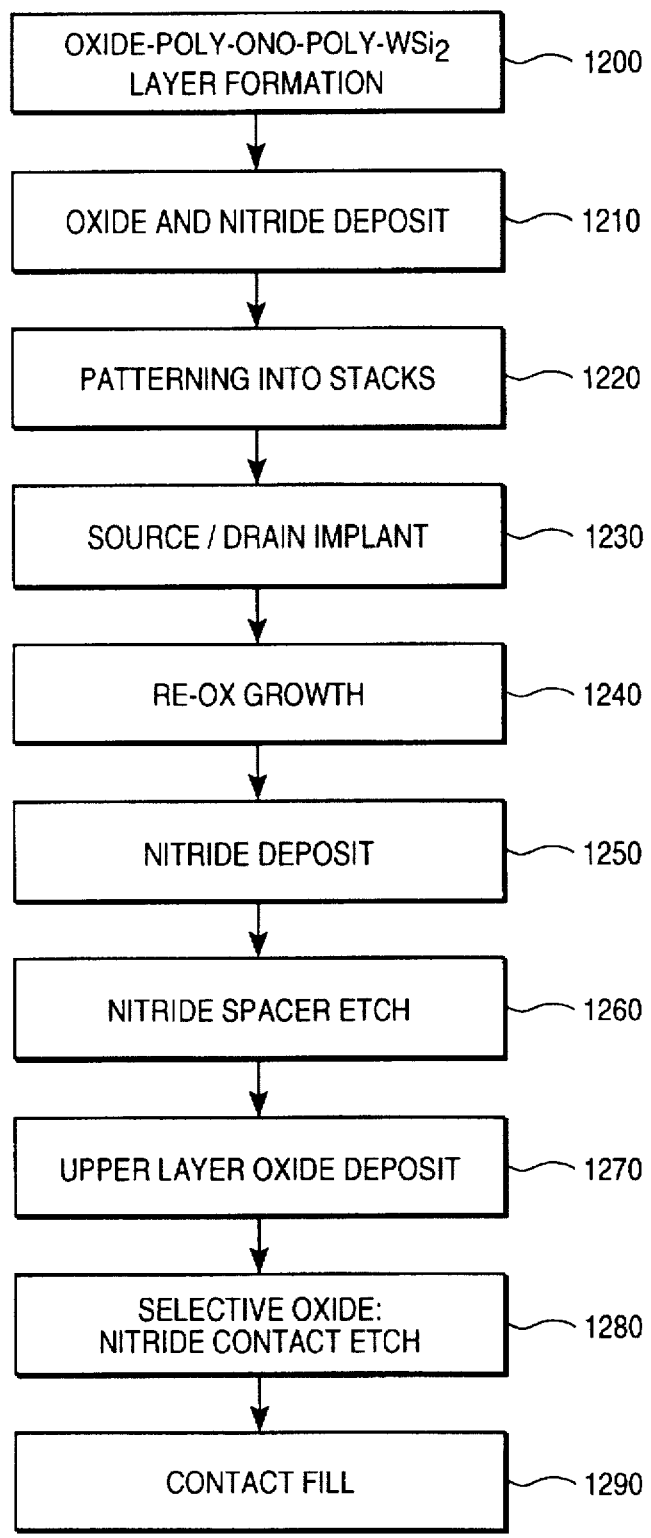
FIG_12

SELF-ALIGNED CONTACT PROCESS IN SEMICONDUCTOR FABRICATION

This is a continuation of application Ser. No. 08/138,741, filed Oct. 15, 1993, now abandoned.

BACKGROUND OF THE INVENTION

1. Field of the Invention

The present invention relates generally to the field of semiconductor device fabrication and more particularly to the field of contact processing in semiconductor device fabrication.

2. Description of the Related Art

Prior art contact processes for semiconductor devices, e.g., erasable programmable read-only memories (EPROM's) or other non-volatile semiconductor memory devices, have required a contact-to-gate spacing of 0.3–0.5 µm to avoid accidental shorts between the gate and the contact filling connecting the diffusion region. FIG. 1, for example, shows a partial top view of a semiconductor memory device where a significant space between two elongated, parallel polycrystalline silicon (polysilicon) word lines 130 is required to allow the placement of contact filling 120 using conventional contact processes without causing a short between the diffusion contact 120 and either word line 130.

FIG. 2 is a partial cross-sectional view of FIG. 1 and more clearly depicts the contact-to-gate spacing required for prior art contact processes. In FIG. 2 each gate stack 135 formed on semiconductor substrate 110 includes a gate oxide layer 131, a first polysilicon layer 132 which serves as a floating gate, an insulative or dielectric layer 133, a second polysilicon layer 130 which serves as a word line or control gate, and an outer insulative oxide layer 134. The semiconductor substrate 110 includes appropriate diffusion regions, such as source regions 111 and 113 and drain region 112, as is well known in the art. The semiconductor substrate 110 and both stacks 135 are disposed in an upper oxide layer 121 where an opening is formed between the two stacks 135 and filled with a metal to form contact filling 120, thus providing an available connection to diffusion or drain region 112. Because stacks 135 are sufficiently spaced apart from one another in FIG. 2, the contact opening and filling 120 are safely formed without causing any diffusion contact to gate shorts.

Without a sufficient contact-to-gate spacing allocation, though, portions of the oxide layer 134 encapsulating each gate stack 135 could potentially get etched away during the contact opening etch in upper oxide layer 121. This could happen, for example, if the patterning layer created for the contact opening etch was not accurately aligned for the etch between gate stacks 135 and/or if the contact opening etched in the upper oxide layer 121 was too large for any given gate-to-gate spacing. As a result, word line 130 and/or floating gate 132 of either or both gate stacks 135 would then become exposed to contact filling 120, rendering the exposed stack(s) inoperable because of the now created diffusion contact to gate short. Contact lithography in the prior art is thus constrained by alignment and contact size requirements for any given gate-to-gate spacing.

While the gate-to-gate spacing could always be made large enough to safely avoid diffusion contact to gate shorts and make contact lithography easier (i.e., with less stringent alignment and contact size requirements), this consideration must be weighed against the high desirability of fabricating semiconductor devices with smaller cell sizes and increased cell densities. Minimizing the contact opening size has been considered not only to avoid diffusion contact to gate shorts but also to help minimize the cell size of the semiconductor device, and hence increase cell density. However, a sufficient contact-to-gate spacing is still required to allow for any misalignment of the patterning layer in etching the contact opening. Furthermore, minimizing the size of contact openings makes contact lithography more difficult and is usually limited by the resolution and depth of focus capability of the patterning technology used.

What is thus needed is a semiconductor device fabrication process which is less sensitive to any misalignment in the patterning layer created for the contact opening etch to reduce or eliminate the contact-to-gate spacing requirement. What is also needed is a semiconductor device fabrication process which is less sensitive to contact size to allow for larger contact openings to be etched in the photoresist layer regardless of the desired cell size for a given semiconductor device, thus making contact lithography processing easier.

BRIEF SUMMARY OF THE INVENTION

The present invention advantageously reduces the cell size in a semiconductor device by eliminating the need to have the contact-to-gate spacing discussed above, without risk of diffusion contact to gate shorts.

In accordance with the present invention each gate stack in a semiconductor device is formed on a semiconductor substrate, encapsulated in an insulative layer, and further encapsulated in an insulative etch-stop layer. Using a selective etch, then, contact openings are formed in an upper insulative layer of the semiconductor device to expose the underlying semiconductor substrate. Because of the etch-stop layer, each gate stack is protected during the selective contact etch. The etch-stop layer further serves to insulate each gate stack from the contact filling material formed in the contact openings, thus avoiding the risk of a diffusion contact to gate short created by the contact filling.

Accordingly, the present invention enables each gate stack in a semiconductor device to be placed closer together, thus reducing cell size, while avoiding the risk of creating diffusion contact to gate shorts. As a result, the cell density of the semiconductor device can be advantageously increased. Furthermore, contact lithography using the present invention becomes easier than in prior art contact processes since the contact opening size can be increased and alignment requirements made less stringent without concern of increasing cell size or of accidentally creating diffusion contact to gate shorts. Overall, the cell size of each gate in a semiconductor device according to the present invention becomes merely limited by the lithographic resolution limits for gate isolation and by the minimum gate length requirements of each cell; the contact-to-gate spacing required in prior art contact processes is no longer a constraint in reducing cell size.

While the above advantages of the present invention have been described, other attendant advantages, objects, and uses of the present invention will become evident to one of ordinary skill in the art based on the following detailed description of the present invention with reference to the accompanying drawings.

BRIEF DESCRIPTION OF THE DRAWINGS

FIG. 1 illustrates the contact-to-gate spacing required in a semiconductor device as a result of prior art contact processes.

FIG. 2 illustrates a partial cross-sectional view of FIG. 1 showing the contact-to-gate spacing required in a semiconductor device as a result of prior art contact processes.

FIG. 3 illustrates a partial view of a semiconductor device where the contact-to-gate spacing required in the prior art has been eliminated as a result if the present invention.

FIG. 4 illustrates a partial cross-sectional view of FIG. 3's semiconductor device where the contact-to-gate spacing required in the prior art has been eliminated as a result of the present invention.

FIG. 5 illustrates the formation of layers during fabrication of a semiconductor device in accordance with the present invention.

FIG. 6 illustrates two gate stacks formed during fabrication of a semiconductor device in accordance with the present invention.

FIG. 7 illustrates source/drain implants and thermal oxidation growth during fabrication of a semiconductor device in accordance with the present invention.

FIG. 8 illustrates a silicon nitride deposition during fabrication of a semiconductor device in accordance with the present invention.

FIG. 9 illustrates the result of a silicon nitride spacer etch during fabrication of a semiconductor device in accordance with the present invention.

FIG. 10 illustrates the formation of an upper oxide layer and contact patterning layer during fabrication of a semiconductor device in accordance with the present invention.

FIG. 11 illustrates the result of a selective contact etch during fabrication of a semiconductor device in accordance with the present invention.

FIG. 12 illustrates a flow diagram depicting the fabrication of the semiconductor device illustrated in FIGS. 3 through 11.

DETAILED DESCRIPTION

An invention is described for contact processing in semiconductor fabrication to reduce the cell size in a semiconductor device without risk of accidental diffusion contact to gate shorts. In the following description, numerous specific details are set forth such as specific thicknesses, materials, processing sequences, deposition methods, semiconductor devices, etc., in order to provide a thorough understanding of the present invention. It will be evident, however, to one of ordinary skill in the art that the present invention may be practiced without these specific details. In other instances, well-known process steps have not been described in detail so that the present invention is not unnecessarily obscured.

As shown in FIG. 3 the contact-to-gate spacing in accordance with the present invention has been significantly reduced thus allowing for a reduction in the gate-to-gate spacing in a semiconductor device. In FIG. 3, as compared to FIG. 1, two word lines 230 of a Flash EPROM are patterned much closer together despite the formation of contact filling 220 which slightly overlaps each word line 230.

FIG. 4, which is a cross-sectional view of FIG. 3, more clearly depicts a partial view of the Flash EPROM in accordance with the present invention where two gate stacks 235 are placed much closer to one another than in the prior art, i.e., as compared to FIG. 2. In FIG. 4, a semiconductor substrate 210 has been provided with appropriate diffusion regions, e.g., source regions 211 and 213 and drain region 212. Each gate stack 235 formed on semiconductor substrate 210 includes a gate oxide layer 231; a first conductive layer 232, preferably made of polysilicon, which serves as a floating gate; a dielectric or insulative layer 233; and a second conductive layer 230, preferably made of polysilicon, which serves as a word line or control gate. Each gate stack 235 of FIG. 4 further includes an optional tungsten silicide ($WSi_2$) layer 236 which serves to advantageously lower the resistance of word lines 230.

Each stack 235 of the present invention is encapsulated in an insulative layer 237, preferably made of silicon dioxide ($SiO_2$), which provides floating gate 232 with better charge retention capabilities, and in an etch-stop layer 238, preferably made of silicon nitride ($Si_3N_4$), which serves to protect each stack 235 during contact etching and to insulate each stack 235 from contact filling 220. Accordingly since each stack 235 is encapsulated in layers 237 and 238, the risk of a short between each gate stack 235 (i.e., each floating gate 232 and/or each control gate 230) and the contact 220 to the diffusion region 212 which was present in prior art contact processes is no longer a concern in forming contact filling 220. As shown in FIG. 4, contact filling 220 can completely occupy the spacing between each stack 235 and can also overlap the tops of each stack 235. The size of contact filling 220 can thus be increased as desired without concern of creating diffusion contact to gate shorts or of increasing cell size of the device. Clearly, contact lithography in accordance with the present invention is easier than in prior art contact processes which required more accurate alignment of the contact filling and more accurately-sized contact fillings to prevent unwanted shorts.

The contact process of the present invention which allows the reduction in the contact-to-gate spacing as shown in FIGS. 3 and 4 is illustrated in FIGS. 5 through 11 and with reference to the flow diagram of FIG. 12. While the description of the present invention with references to the accompanying drawings discuss the present invention in the context of two stacks formed on a semiconductor substrate, it is to be understood that this description is merely illustrative for a clearer understanding of the present invention. The views of FIGS. 3 through 11 are of course partial views of a larger semiconductor device which includes other gates. Furthermore, it is to be appreciated that the present invention is not limited to the formation of contact openings between two gate stacks but rather also applies to the formation of a contact opening anywhere near a single gate stack of any kind where a region to be connected by the contact filling lies close to the gate stack and where the attendant risk of a short between the gate and the region to be connected by the contact filling is to be avoided.

In FIG. 5, a semiconductor substrate 210, which is preferably a silicon substrate, is provided to form the semiconductor memory device of the present invention. Although not shown, silicon substrate 210 has been subjected to a local oxidation of silicon (LOCOS) isolation process which defines long narrow stripes of active regions on silicon substrate 210 separated by stripes of field oxide isolation regions. In Step 1200 of FIG. 12, a gate oxide layer 231a is grown on substrate 210 in the defined active regions using a dry oxidation step. While in the preferred embodiment approximately 100 Å of silicon dioxide ($SiO_2$) is grown over substrate 210 in the defined active regions as gate oxide layer 231a, other silicon dioxide thicknesses, preferably less than approximately 120 Å, may be used. Next, a conductive layer 232a is deposited using Chemical Vapor Deposition (CVD) over semiconductor substrate 210. In the preferred embodiment conductive layer 232a is a phosphorous doped polycrystalline silicon (polysilicon or poly-Si) layer approximately 1500 Å in thickness, although other thicknesses of this poly-Si layer, preferably in the range of approximately 700–1500 Å, may be used. Conductive layer 232a is then patterned in one dimension to form stripes of polysilicon which straddle gate oxide layer 231a in the active regions.

Following the patterning of conductive layer 232a, an inter-gate insulative layer 233a is formed over substrate 210. This layer 233a is preferably an oxide-nitride-oxide or ONO ($SiO_2$—$Si_3N_4$—$SiO_2$) tri-layer where a first oxide layer of approximately 60 Å in thickness is grown over layer 232a, a nitride layer of approximately 80 Å in thickness is deposited over the first oxide layer, and a second oxide layer of approximately 80 Å in thickness is deposited over the nitride layer. Of course other thicknesses of these ONO layers may be used. Following the formation of insulative layer 233a, a second conductive layer 230a is deposited. In the preferred embodiment approximately 1500 Å of poly-Si is deposited and doped with phosphorous, although other thicknesses of this poly-Si layer, preferably in the range of approximately 700–1500 Å, may be used. This second conductive layer 230a is further covered with a tungsten silicide ($WSi_2$) layer 236a which serves to lower the resistance of conductive layer 230a. In the preferred embodiment approximately 2000 Å of tungsten silicide is deposited using CVD here, although other tungsten silicide thicknesses, preferably in the range of approximately 1000–2000 Å, may be used. Of course it is to be appreciated that tungsten silicide layer 236a is optional in practicing the present invention. Additionally, other types of layers which serve to lower the resistance of conductive layer 230a may also be optionally used.

In Step 1210, an insulative layer 237a is formed over layer 236a. While in the preferred embodiment approximately 200 Å of silicon dioxide is deposited using CVD here, other silicon dioxide thicknesses, preferably over approximately 100 Å, may be used. Silicon dioxide layer 237a is preferably deposited here rather than grown to avoid subjecting tungsten silicide layer 236a to two oxidation steps, as this tungsten silicide will later be subjected to an oxide growth step. Subjecting tungsten silicide to a second oxidation step could result in the peeling of layer 236a due to changes in its stoichiometry incurred during a first oxidation step. Of course, depending on the properties of the tungsten silicide and the exact process sequence, insulative layer 237a may be grown rather than deposited.

An etch-stop layer 238a is then deposited over insulative layer 237a. While in the preferred embodiment approximately 1000 Å of silicon nitride is deposited here, other silicon nitride thicknesses, preferably over approximately 500 Å, may be used. It is to be noted silicon dioxide layer 237a serves not only as an insulator here but also as a buffer layer for silicon nitride layer 238a since tungsten silicide and silicon nitride both have stress in them. In addition, silicon dioxide layer 237a also serves to prevent any adverse reactions which occur between the preferred nitride deposition chemistry, which involves dichlorosilane and ammonia, and tungsten silicide. It is to be understood that silicon dioxide layer 237a is optional and may be omitted where, for example, depositing etch-stop layer 238a on the underlying layer is not a problem.

Subsequent to the deposition of silicon nitride layer 238a, the layers of FIG. 5 are patterned into gate stacks 235 in Step 1220, as shown in FIG. 6. This patterning is performed by depositing a photoresist layer over the substrate, aligning and exposing the photoresist layer to create the hardened photoresist strips 258 shown in FIG. 5. The underlying layers 230a through 238a of FIG. 5 are then etched using well-known methods to create gate stacks 235 as shown in FIG. 6. This patterning step 1220 defines the second dimension of floating gates 232 and defines word lines 230 of the semiconductor device.

Once the two stacks 235 have been formed, appropriate diffusion regions, e.g., source regions 211 and 213 and drain region 212 as shown in FIG. 7, are implanted in substrate 210 using well-known methods in Step 1230. An oxide layer (re-ox) 270 is then thermally grown on gate stacks 235 to insulate each control gate 230 and each floating gate 232 and on diffusion regions 211,212, and 213 in Step 1240. This oxide is a high quality oxide which provides for improved charge retention by floating gates 232. While a deposited oxide may be used in an alternative embodiment, use of a grown oxide, in addition to providing a high quality oxide, also consumes any damaged regions of each floating gate 232 caused during the patterning of stacks 235 in Step 1220 while ensuring that the entire floating gate 232 is enclosed with oxide, including irregularities such as gaps, etc., in damaged gates. The thickness of the oxide here will, of course, depend on the amount of doping in the semiconductor material where the oxide is to be grown. In the preferred embodiment approximately 500 Å of oxide is grown on the sides of each floating gate 232, although the growth of oxide here to other thicknesses, preferably over approximately 200 Å, may be used. For the diffusion regions 211,212, and 213 and the sides of layers 230 and 236 near the top of each stack 235, oxide growth here will typically be in the range of approximately 800–1000 Å although other thicknesses may be used.

Following the re-ox growth, a silicon nitride layer 280 is deposited over the substrate in Step 1250, covering the tops and sides of stacks 235 as shown in FIG. 8. While in the preferred embodiment approximately 800 Å of silicon nitride is deposited here, other silicon nitride thicknesses, preferably over approximately 500 Å, may be used. This silicon nitride layer 280 is subsequently anisotropically etched in Step 1260 to form sidewall spacers. In the anisotropic etch, the silicon nitride of silicon nitride layer 280 is removed from the top of each stack 235 and from silicon substrate 210; none or only an insignificant amount of silicon nitride is removed from the sides of each stack 235 during this etch. Because of the re-ox growth over diffusion regions 211,212, and 213, the resulting nitride sidewall spacers on each stack 235 will not typically extend all the way down to substrate 210. It is to be noted that even with a slight over-etch, silicon nitride will still be present on the tops of each stack 235 from the first deposited silicon nitride layer 238a. As a result, both stacks 235 are now protected with an insulative oxide layer 237 and a silicon nitride etch-stop layer 238 as shown in FIG. 9.

Following the encapsulation of the stacks 235 in silicon nitride etch-stop layer 238, an upper insulative or dielectric layer 221 is formed over the semiconductor device in Step 1270 as shown in FIG. 10. Preferably, a series of undoped and doped oxides are deposited and reflown to planarize the semiconductor device as is known in the art to create an upper layer 221. While in the preferred embodiment upper layer 221 is made of approximately 8000 Å of borophosphosilicate glass (BPSG), other BPSG thicknesses or various thicknesses of other dielectric materials may be used for upper layer 221. In Step 1280, then, the contact areas over appropriate diffusion regions, e.g., drain region 212, are defined on top of upper layer 221 using photolithography where a photoresist layer is deposited over upper layer 221, aligned and exposed to create patterned photoresist layer 290 having openings 291.

Then, the oxide in each contact area (e.g., in the openings 291) is etched using an anisotropic, selective oxide:nitride etch technique that serves to etch the oxide in each contact area at a much faster rate than any silicon nitride or silicon in each contact area. The oxide to nitride etch selectivity is preferably 15 or greater. As a result, each stack 235 remains protected by its silicon nitride etch-stop layer 238 in the contact areas during the contact etch. The oxide in these contact areas, however, is etched off until the diffusion regions, e.g., drain region 212, are exposed at the bottom between the stacks 235, creating contact opening 300 as shown in FIG. 11. Although the lower sides of each stack 235 in the contact area are not protected by silicon nitride etch-stop layer 238, the insulative oxide layer 237 grown there nevertheless remains since the oxide:nitride etch is anisotropic; the lower sides of each stack 235 are not significantly affected by this etch and hence remain protected by insulative oxide layer 237. Following the contact opening etch, photoresist layer 290 is appropriately removed.

Clearly, contact lithography as a result of the present invention is less constrained by contact opening size and/or contact opening alignment requirements that existed in the prior art. In accordance with the present invention, the contact opening must merely be coarsely aligned over the underlying diffusion region which is to be connected for the contact filling to be self-aligned to the gate. That is, since the gate is now protected, minor misalignment in either direction will cause no harm as the conductive material filling opening 300 can lie atop a stack 235 without causing a short. Additionally, the contact opening size can be increased without concern of creating diffusion contact to gate shorts or of increasing cell size. Indeed, as shown in FIG. 11, contact opening 300 can be created in upper layer 221 to cover the entire region between each stack 235 and additionally to cover regions directly over the stacks 235 so that even when the contact opening 300 is misaligned, one hundred percent coverage is achieved at the bottom of the contact opening. Of course, although a contact aligned to the edges of two adjacent gates has been shown, the present invention may be used to align a contact to the edge of a single gate.

Following the selective contact etch, the resulting contact opening 300 can be filled with any appropriate conductive material, e.g., a metal, using well-known methods in Step 1290 without concern of accidentally creating diffusion contact to gate shorts. In the preferred embodiment tungsten plugs, formed by blanket tungsten deposition and etch-back, are used since they are ideal for filling up small contact openings such as the narrow spacings 300 created here between gate stacks 235. As a result, contact filling 220 as shown in FIG. 4 is formed to provide an available connection to drain region 212. Conductive lines can then later be patterned over contact filling 220 as well as other contact fillings to form appropriate interconnections as desired.

As can be seen in FIG. 4, as compared to the prior art shown in FIG. 2, the present invention allows each gate stack 235 to be patterned much closer together, providing for a smaller cell size and a higher cell density in the semiconductor device being fabricated without the attendant risk of creating diffusion contact to gate shorts that existed in the prior art. Indeed, each gate stack 235 can be placed as close to one another as lithographic resolution limits for gate isolation permit. For example, in a 0.4 µm process gate stacks 235 can be placed as close as 0.4 µm apart. As a result of the present invention, contact lithography is no longer constrained by the stringent alignment and contact opening size requirements that existed in the prior art for any given gate-to-gate spacing. Rather, contact opening sizes can be increased and alignment tolerance made less stringent without concern of increasing, cell size or of creating diffusion contact to gate shorts. Thus, an invention for contact processing in semiconductor fabrication to reduce the cell size in a semiconductor device without risk of accidental diffusion contact to gate shorts has been described.

While the etch-stop layer 238 is preferably made of silicon nitride as described above, it is to be appreciated that other types of materials, e.g., aluminum-oxide ($Al_2O_3$), a silicon rich oxide (e.g., SiO), silicon oxynitride ($SiO_xN_y$), may be formed using well-known methods to encapsulate each gate stack 235 in the semiconductor device in realizing the advantages of the present invention. Of course, the selective contact etch used will be based upon the desired type of material chosen for the etch-stop layer 238 and the upper dielectric layer 221. For example, with an aluminum-oxide etch-stop layer 238 and an upper oxide layer 221, a selective oxide:aluminum-oxide contact etch will be necessary to create contact openings 300 in upper layer 221.

Also, while the etch-stop layer is preferably formed by depositing a first etch-stop layer in Step 1210 and depositing a second etch-stop layer in Step 1250 using the same material in each step, it is to be appreciated that the material used to form the first etch-stop layer may differ from that used to form the second etch-stop layer. Of course, each of the different materials used here may be formed using well-known methods, and, necessarily, the selective contact etch chosen to be used here will etch the material in upper layer 221 at a faster rate than either material used to form the different etch-stop layers.

Furthermore, while the present invention has been described in terms of the formation of an available connection to drain region 212, it is to be appreciated that the present invention may also be used to form available connections to other regions, e.g., source regions 211 or 213, in the near vicinity surrounding or adjacent to gate stacks 235.

Lastly, while the present invention has been described above with regard to the best mode and preferred embodiment or embodiments contemplated by the inventors, it is to be appreciated that the present invention is not limited to the specific embodiment or embodiments described above and that various modifications may be made to the specific embodiment or embodiments described above without departing from the broader spirit or scope of the present invention as defined in the following claims.

What is claimed is:

1. A method of forming a semiconductor device on a semiconductor substrate comprising the steps of:
    a) forming a stack on the semiconductor substrate, the stack comprising a gate;
    b) forming a first insulative layer over exposed portions of the gate;
    c) forming a stack etch-stop layer around the stack;
    d) forming a second insulative layer over the semiconductor substrate and around the stack wherein the etch-stop layer comprises a different material than the second insulative layer;
    e) forming an opening in the second insulative layer over a region on the semiconductor substrate adjacent to the stack in an etch process that etches the second insulative layer at a greater rate than the etch-stop layer such that the gate is protected during the etch process; and
    f) filling the opening with a conductive material.

2. The method of claim 1, wherein the forming steps (a), (b), and (c) comprise the steps of:
    forming a gate insulative layer over the semiconductor substrate;
    depositing a conductive layer over the gate insulative layer;

forming the first insulative layer over the conductive layer;

forming a first etch-stop layer over the first insulative layer, the first etch-stop layer forming a first portion of the stack etch-stop layer;

forming the stack from the gate insulative layer, the conductive layer, the first insulative layer, and the first etch-stop layer, wherein the gate comprises at least a portion of the conductive layer;

forming the first insulative layer on sides of the stack;

forming a second etch-stop layer over the semiconductor substrate, the second etch-stop layer forming a second portion of the stack etch-stop layer; and removing the second etch-stop layer at least from a region on the semiconductor substrate while leaving at least some of the second etch-stop layer on the sides of the stack and at least some of the first etch-stop layer on top of the stack to form the stack etch-stop layer.

3. The method of claim 2, wherein the first insulative layer comprises oxide and wherein the step of forming the first insulative layer on sides of the stack comprises the step of thermally growing the oxide.

4. The method of claim 3, further comprising the steps of depositing a metal silicide layer over the conductive layer, and forming a buffer layer over the metal silicide layer, wherein the stack comprises a portion of the metal silicide layer and a portion of the buffer layer.

5. The method of claim 2, further comprising the steps of depositing a metal silicide layer over the conductive layer, and forming a buffer layer over the metal silicide layer, wherein the stack comprises a portion of the metal silicide layer and a portion of the buffer layer.

6. The method of claim 1, wherein the first insulative layer comprises oxide and wherein the forming step (b) comprises the step of thermally growing the oxide.

7. The method of claim 6, further comprising the steps of depositing a metal silicide layer over the conductive layer, and forming a buffer layer over the metal silicide layer, wherein the stack comprises a portion of the metal silicide layer and a portion of the buffer layer.

8. The method of claim 1, wherein the gate is a floating gate.

9. The method of claim 1, wherein the gate is a control gate.

10. The method of claim 1, wherein the stack etch-stop layer comprises a material selected from the group consisting of silicon nitride, aluminum oxide, silicon oxynitride, and silicon rich oxide.

11. The method as described in claim 1 wherein the opening is formed so that a portion of the opening overlies at least an edge of the stack.

12. The method as described in claim 11 wherein the opening is formed such that the opening overlies a top portion of the stack.

13. A method of forming a semiconductor device on a semiconductor substrate comprising the steps of:

a) forming two stacks on the semiconductor substrate, each stack comprising a floating gate and a control gate;

b) forming a first insulative layer over at least exposed portions of the floating gate of each stack;

c) forming a stack etch-stop layer around each stack;

d) forming a second insulative layer over the semiconductor substrate and around the stacks wherein the etch-stop layer comprises a different material than the second insulative layer;

e) forming an opening in the second insulative layer between the stacks in an etch process that etches the second insulative layer at a greater rate than the etch-stop layer such that the gate of each stack is protected during the etch process; and f) filling the opening with a conductive material.

14. The method of claim 13, wherein the forming steps (a), (b), and (c) comprise the steps of:

forming a gate insulative layer over the semiconductor substrate;

depositing a first conductive layer over the gate insulative layer;

forming an inter-gate dielectric layer over the first conductive layer;

depositing a second conductive layer over the inter-gate dielectric layer;

forming the first insulative layer over the second conductive layer;

forming a first etch-stop layer over the first insulative layer, the first etch-stop layer forming a first portion of the stack etch-stop layer;

forming the two stacks from the gate insulative layer, the first conductive layer, the inter-gate dielectric layer, the second conductive layer, the first insulative layer and the first etch-stop layer, wherein the floating gate of each stack comprises at least a portion of the first conductive layer and wherein the control gate of each stack comprises at least a portion of the second conductive layer;

forming the first insulative layer on sides of each stack;

forming a second etch-stop layer over the semiconductor substrate, the second etch-stop layer forming a second portion of the stack etch-stop layer; and removing the second etch-stop layer at least from a region between the stacks while leaving at least some of the second etch-stop layer on the sides of each stack and at least some of the first etch-stop layer on top of each stack to form the stack etch-stop layer.

15. The method of claim 14, wherein the first insulative layer of each stack comprises oxide and wherein the step of forming the first insulative layer on sides of each stack comprises the step of thermally growing the oxide.

16. The method of claim 15, further comprising the steps of depositing a metal silicide layer over the second conductive layer, and forming a buffer layer over the metal silicide layer, wherein the two stacks each comprise a portion of the metal silicide layer and a portion of the buffer layer.

17. The method of claim 14, further comprising the steps of depositing a metal silicide layer over the second conductive layer, and forming a buffer layer over the metal silicide layer, wherein the two stacks each comprise a portion of the metal silicide layer and a portion of the buffer layer.

18. The method of claim 13, wherein the first insulative layer of each stack comprises oxide and wherein the forming step (b) comprises the step of thermally growing the oxide.

19. The method of claim 18, further comprising the steps of depositing a metal silicide layer over the second conductive layer, and forming a buffer layer over the metal silicide layer, wherein the two stacks each comprise a portion of the metal silicide layer and a portion of the buffer layer.

20. The method of claim 13, wherein the two stacks are separated by a distance and wherein the opening formed in the second insulative layer between the two stacks has a dimension equal to or greater than the distance.

21. The method of claim 13, wherein the stack etch-stop layer comprises a material selected from the group consisting of silicon nitride, aluminum oxide, silicon oxynitride, and silicon rich oxide.

22. The method as described in claim 13 wherein the opening is formed so that a portion of the opening overlies at least an edge of at least one of the stacks.

23. The method as described in claim 22 wherein the opening is formed such that the opening overlies a top portion of at least one of the stacks.

* * * * *